(12) United States Patent
Liu et al.

(10) Patent No.: US 11,249,551 B2
(45) Date of Patent: Feb. 15, 2022

(54) ELECTROSTATIC FEEDBACK DISPLAY ARRAY, AN ACTIVE DRIVING METHOD, AND A CIRCUIT

(71) Applicant: Shenzhen China Star Optoelectronics Semiconductor Display Technology Co., Ltd., Shenzhen (CN)

(72) Inventors: Nian Liu, Shenzhen (CN); Macai Lu, Shenzhen (CN)

(73) Assignee: Shenzhen China Star Optoelectronics Semiconductor Display Technology Co., Ltd., Shenzhen (CN)

(*) Notice: Subject to any disclaimer, the term of this patent is extended or adjusted under 35 U.S.C. 154(b) by 216 days.

(21) Appl. No.: 16/646,572

(22) PCT Filed: Dec. 27, 2019

(86) PCT No.: PCT/CN2019/129055
§ 371 (c)(1),
(2) Date: Mar. 12, 2020

(87) PCT Pub. No.: WO2021/114415
PCT Pub. Date: Jun. 17, 2021

(65) Prior Publication Data
US 2021/0397258 A1 Dec. 23, 2021

(30) Foreign Application Priority Data

Dec. 12, 2019 (CN) .......................... 201911272488.2

(51) Int. Cl.
*G06F 3/01* (2006.01)
*G06F 3/044* (2006.01)
*H01L 27/12* (2006.01)
*G06F 3/041* (2006.01)

(52) U.S. Cl.
CPC .............. *G06F 3/016* (2013.01); *G06F 3/044* (2013.01); *G06F 3/0412* (2013.01); *G06F 3/0416* (2013.01); *H01L 27/1225* (2013.01)

(58) Field of Classification Search
None
See application file for complete search history.

(56) References Cited

U.S. PATENT DOCUMENTS

2015/0378223 A1* 12/2015 Wen .................. H01L 21/76804
349/40
2020/0395652 A1* 12/2020 Mityashin ............ H01Q 1/2225

* cited by examiner

*Primary Examiner* — Stephen T. Reed

(57) ABSTRACT

An electrostatic feedback display array, an active driving method, and a circuit. The array includes a substrate, an insulation layer on the substrate, a passivation layer on the insulation layer, a dielectric layer on the passivation layer, an inductive TFT and a driving TFT in the insulation layer. The passivation layer has an LED and electrically connects to a first electrode of the LED. The dielectric layer has a second electrode. The source of the inductive TFT electrically connects to the second electrode. The driving TFT has a source electrically connected to the first electrode device, and a gate electrically connected to a source of inductive TFT. The invention utilizes TFTs to control a touch electrostatic feedback switch, integrates electrostatic feedback, capacitance sensing and display functions, realizes boundary perceptible haptic feedbacks, avoids direct connection and harmful consequences of high voltage source to the human body, and improve safety.

10 Claims, 7 Drawing Sheets

─ S510

When a finger touches the dielectric layer for the first time, inputting a high voltage level signal into the gate terminal of the inductive TFT device, a high-frequency high voltage level signal into the drain terminal of the inductive TFT device, wherein the high voltage level signal and the high-frequency high voltage level signal are used to generate static electricity between the second electrode and the finger.

─ S520

Inputting a high voltage level signal to the gate terminal of the inductive TFT device, and a low voltage level signal to the drain terminal of the inductive TFT device, wherein the high voltage level signal and the low voltage level signal are used to drive a voltage level of the second electrode to zero.

─ S530

Using the static electricity to drive the second electrode to generate a voltage level when the finger touches the dielectric layer for a second time, wherein the generated voltage level is used to drive the driving TFT device to transmit a voltage signal to an LED device.

FIG. 5 form
ELECTROSTATIC FEEDBACK DISPLAY ARRAY, AN ACTIVE DRIVING METHOD, AND A CIRCUIT

RELATED APPLICATIONS

This application is a National Phase of PCT Patent Application No. PCT/CN2019/129055 having International filing date of Dec. 27, 2019, which claims the benefit of priority of Chinese Patent Application No. 201911272488.2 filed on Dec. 12, 2019. The contents of the above applications are all incorporated by reference as if fully set forth herein in their entirety.

FIELD AND BACKGROUND OF THE INVENTION

The present invention relates to a technical field of display panel technologies, and more particularly, an electrostatic feedback display array, an active driving method, and a circuit.

Current haptic feedback technology mainly uses MOD integrated linear motors or electrostatic driven friction modulation technology. A linear motor with an intrinsic large size may generate boundary-less vibration and cannot realize regional feedbacks. Electrostatic friction modulation can realize boundary-perceptible haptic feedbacks, and if integrated in the display panel, can also emulate texture and 3D sense experience to enhance human-machine interaction. However, a sufficiently large voltage, usually greater than 100V, is required to produce a large force. If a protective film of a display panel is damaged, the high voltage may directly short to a human body, and cause a safety risk during user operations.

SUMMARY OF THE INVENTION

Technical problems: In the process of implementation, the inventor found at least the following problems in traditional technology: haptic feedbacks are barely boundary perceptible in traditional display panel, and feedback triggering has a problem of low safety.

Accordingly, it is desirable to provide an electrostatic feedback display array, an active driving method, and a circuit for the boundary imperceptible problem and the low safety problem of traditional display haptic feedbacks.

To achieve the objective, an embodiment of the invention provides an electrostatic feedback display array comprising:
  a substrate;
  an insulation layer located on the substrate;
  a passivation layer located on the insulation layer, and electrically connected to a first electrode of a light emitting diode (LED) device located on the passivation layer;
  a dielectric layer located on the passivation layer, and equipped with a second electrode;
  an inductive thin-film transistor (TFT) device located within the insulation layer, wherein a source terminal of the inductive TFT device is electrically connected to the second electrode;
  a driving TFT device located within the insulation layer, wherein the driving TFT device comprises a source terminal of electrically connected to the first electrode, and a gate terminal electrically connected to the source terminal of the inductive TFT device.

In an embodiment of the invention, a buffer layer located between the substrate and the insulation layer. The buffer layer is equipped with a light-shielding component to block the driving TFT device.

In an embodiment of the invention, the insulation layer is a transparent insulation layer.

In an embodiment of the invention, the second electrode is a transparent electrode.

In an embodiment of the invention, the driving TFT device is an indium gallium zinc oxide (IGZO) type TFT device, and the inductive TFT device is an IGZO type TFT device.

In an embodiment of the invention, the passivation layer comprises a first passivation sublayer located on the insulation layer and a second passivation sublayer arranged between the first passivation sublayer and the dielectric layer. The LED device and the first electrode are located in the second passivation sublayer.

In an embodiment of the invention, the substrate is a glass plate.

In an embodiment of the invention, a protective film is located on the dielectric layer.

In another aspect, an embodiment of the invention provides a method for actively driving an electrostatic feedback display array, comprising the following steps:
  inputting a high voltage level signal into a gate terminal of an inductive TFT device, and a high-frequency high voltage level signal to a drain terminal of the inductive TFT device when a finger touches a dielectric layer for a first time, where the high voltage level signal and the high-frequency high voltage level signal drives generation of static electricity between a second electrode and the finger;
  inputting a high voltage level signal to the gate terminal of the inductive TFT device, and a low voltage level signal to the drain terminal of the inductive TFT device, where the high voltage level signal and the low voltage level signal are used to drive a voltage level of the second electrode to zero; and
  using the static electricity to drive the second electrode to generate a voltage level when the finger touches the dielectric layer for a second time, where the generated voltage level is used to drive a driving TFT device to transmit a voltage signal to an LED device.

In another aspect, an embodiment of the invention provides a circuit for actively driving an electrostatic feedback display array, comprising:
  an inductive TFT device;
  a driving TFT device; and
  a capacitor;
  wherein a source terminal of the inductive TFT device is connected to a gate terminal of the driving TFT device, one end of the capacitor is connected to the source terminal of the inductive TFT device, the other end of the capacitor is connected to a drain terminal of the driving TFT device, and a source terminal of the driving TFT device is used to connect an LED device.

Useful effects of the invention includes: n the embodiments of the electrostatic feedback display array, an insulation layer is located on the substrate. A passivation layer is located on the insulation layer, and electrically connected to a first electrode of a LED device located on the passivation layer. A dielectric layer is equipped with a second electrode. An inductive TFT device is located within the insulation layer, wherein a source terminal of the inductive TFT device is electrically connected to the second electrode. A driving TFT device is located within the insulation layer, wherein the driving TFT device comprises a source terminal electrically connected to the first electrode, and a gate terminal electrically connected to the source terminal of the inductive TFT device. Further, when a high-frequency high voltage level signal is input to a gate terminal of the inductive TFT device, and a high level signal is input to a drain terminal of the inductive TFT device, the inductive TFT device is on, and a voltage level of the second electrode varies with the input high-frequency high voltage level signal. If the finger touches the dielectric layer, an electrostatic force is generated between the second electrode device and the finger. When a high voltage level signal is input to the drain terminal of the inductive TFT device, and a low voltage level signal is input to the gate terminal of the inductive TFT device, the voltage level of the second electrode is zeroed to an initial voltage level. When the finger touches the dielectric layer surface, the voltage level of the second electrode increases, which drives the driving TFT device to transmit a voltage signal to the LED device, enabling actively driven electrostatic feedback modulation. This application utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

BRIEF DESCRIPTION OF THE SEVERAL VIEWS OF THE DRAWINGS

The application will be further explained in the following accompanied with the drawings and embodiments:

FIG. 5 is a flow diagram of a method for actively driving an electrostatic feedback display array according to an embodiment of the invention.

DESCRIPTION OF SPECIFIC EMBODIMENTS OF THE INVENTION

To facilitate a clearer understanding of the technical characteristics, purpose and effect of the application, the detailed embodiments of this application is detailed with reference to the drawings.

Figure 1:
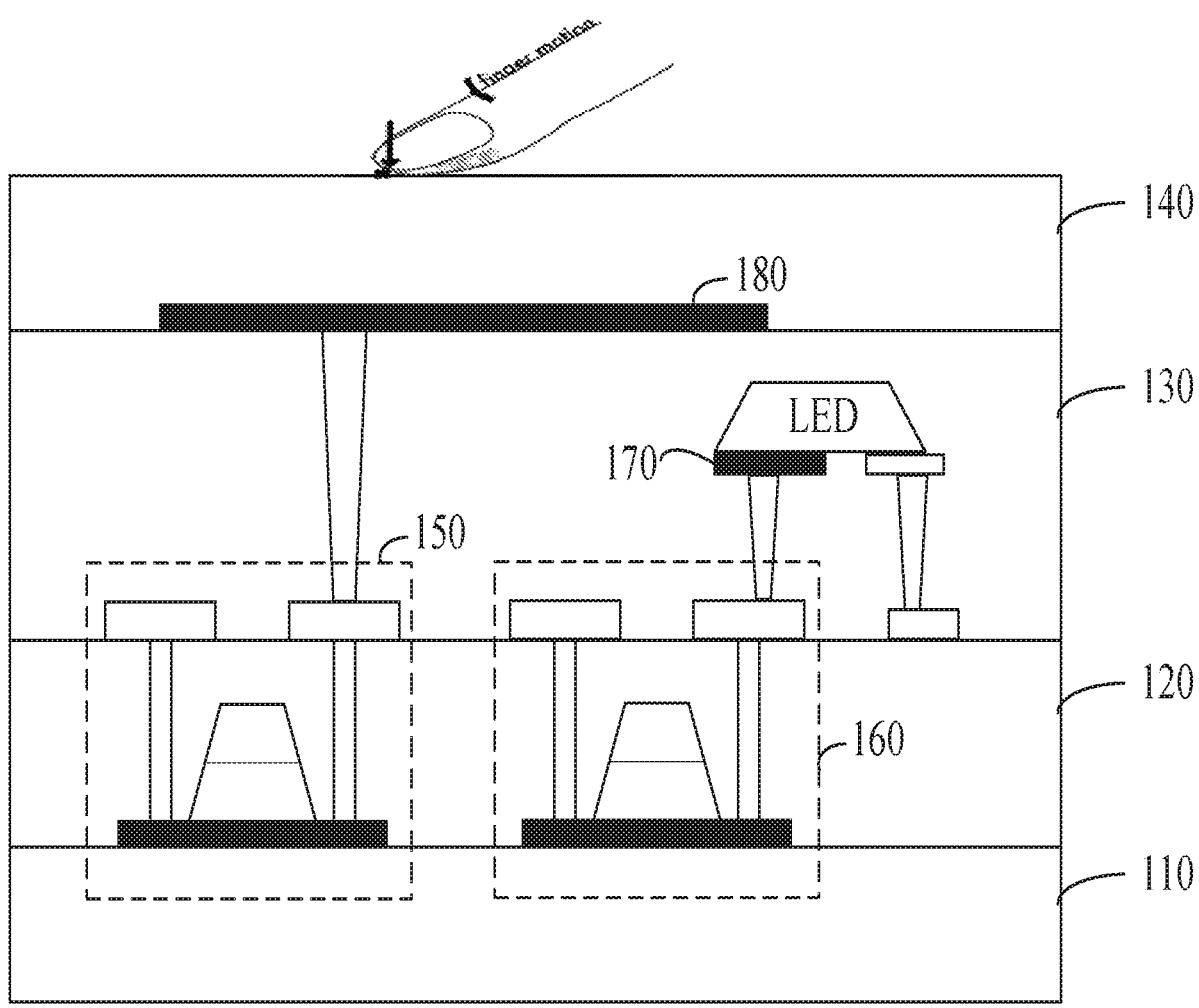
FIG. 1 is the first structural diagram of an electrostatic feedback display array according to an embodiment of the invention.

To address the boundary imperceptible problem and the low safety problem of traditional display haptic feedbacks, as shown in FIG. 1, an electrostatic feedback display array is provided, including:

a substrate 110;

an insulation layer 120 located on the substrate 110;

a passivation layer 130 located on the insulation layer 120, and electrically connected to a first electrode 170 of a LED device located on the passivation layer 130;

a dielectric layer 140 located on the passivation layer 130, and equipped with a second electrode 180;

an inductive TFT device 150 located within the insulation layer 120, wherein a source terminal of the inductive TFT device 150 is electrically connected to the second electrode 180;

a driving TFT device 160 located within the insulation layer 120, wherein the driving TFT device 160 comprises a source terminal of electrically connected to the first electrode 170, and a gate terminal electrically connected to the source terminal of the inductive TFT device 150.

In particular, the substrate 110 is a basic component of a display device. For example, the substrate 110 may be a glass substrate. The thickness of the substrate 110 can be set according to the real application. The insulation layer 120 refers to an interlayer insulation layer. The material of the insulation layer 120 may include, but not limited to, silicon nitride (SiNx) or silica oxide (SiO2). The passivation layer 130 is a passivation part in the display array. Passivation is to convert a metal surface into a state that the metal cannot be easily oxidized, which slows down corrosion of the metal. The dielectric layer 140 can be used to preserve the insulation between the layers. The light emitting diode (LED) device may include, but not limited to, monochrome LED devices or color LED devices. The first electrode 170 is located in the passivation layer, and can be used to transmit a driving signal to the LED device. The second electrode 180 is located in the dielectric layer. The second electrode 180 can be used to transmit a voltage signal to the source terminal of the inductive TFT device, and can also be used to generate electrostatic forces for fingers touching the dielectric layer.

The driving thin-film field-effect transistor (TFT) device 160 refers to a TFT device used to drive operations of the LED device. The driving TFT device 160 transmits a current signal to the LED device to drive the LED device on to light. The inductive TFT device 150 can be used to control on or off of the gate terminal of the driving TFT device. For example, when the inductive TFT device 150 is on, a voltage level signal input to the inductive TFT device 150 can drive the gate terminal of the driving TFT device to be turned on, which can turn on the driving TFT device.

Specifically, the insulation layer 120 is disposed on the substrate 110. The passivation layer 130 is disposed on the insulation layer 120. The dielectric layer 140 is disposed on the passivation layer 130. The passivation layer 130 is equipped with a LED device and is electrically connected to a first electrode 170 of the LED device. The dielectric layer 140 has a second electrode 180. The inductive TFT device 150 is located within the insulation layer 120. The source terminal of the inductive TFT device 150 is electrically connected to the second electrode 180. The driving TFT device 160 is located within the insulation layer 120. The source terminal of the driving TFT device 160 is electrically connected to the first electrode 170, and the gate terminal of the driving TFT device 160 is electrically connected to the source terminal of the inductive TFT device 150, to input a high-frequency high voltage level signal to the gate terminal of the inductive TFT device 150. When a high voltage level signal is input to the drain terminal of the inductive TFT device 150, the inductive TFT device 150 is on, and the voltage level of the second electrode 180 varies with the high-frequency high voltage level signal. If a finger touches the dielectric layer, static electricity is produced between the second electrode 180 and the finger. When a high voltage signal is input to the drain terminal of the inductive TFT device 150, and a low voltage signal is input to the gate terminal of the inductive TFT device 150, the voltage level of the second electrode 180 is zeroed to an initial voltage level. When a finger touches the dielectric layer surface, the voltage level of the second electrode 180 is raised, which drives the driving TFT device 160 to transmit a voltage signal to the LED device, enabling active driving for electrostatic feedback modulation.

Further, the substrate, the insulation layer, the passivation layer and the dielectric layer are stacked in a layered structure.

In one example, the substrate is a glass sheet. Specifically, the substrate can be a thin piece of glass with an extremely flat surface.

An embodiment of the electrostatic feedback display array utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

Figure 2:
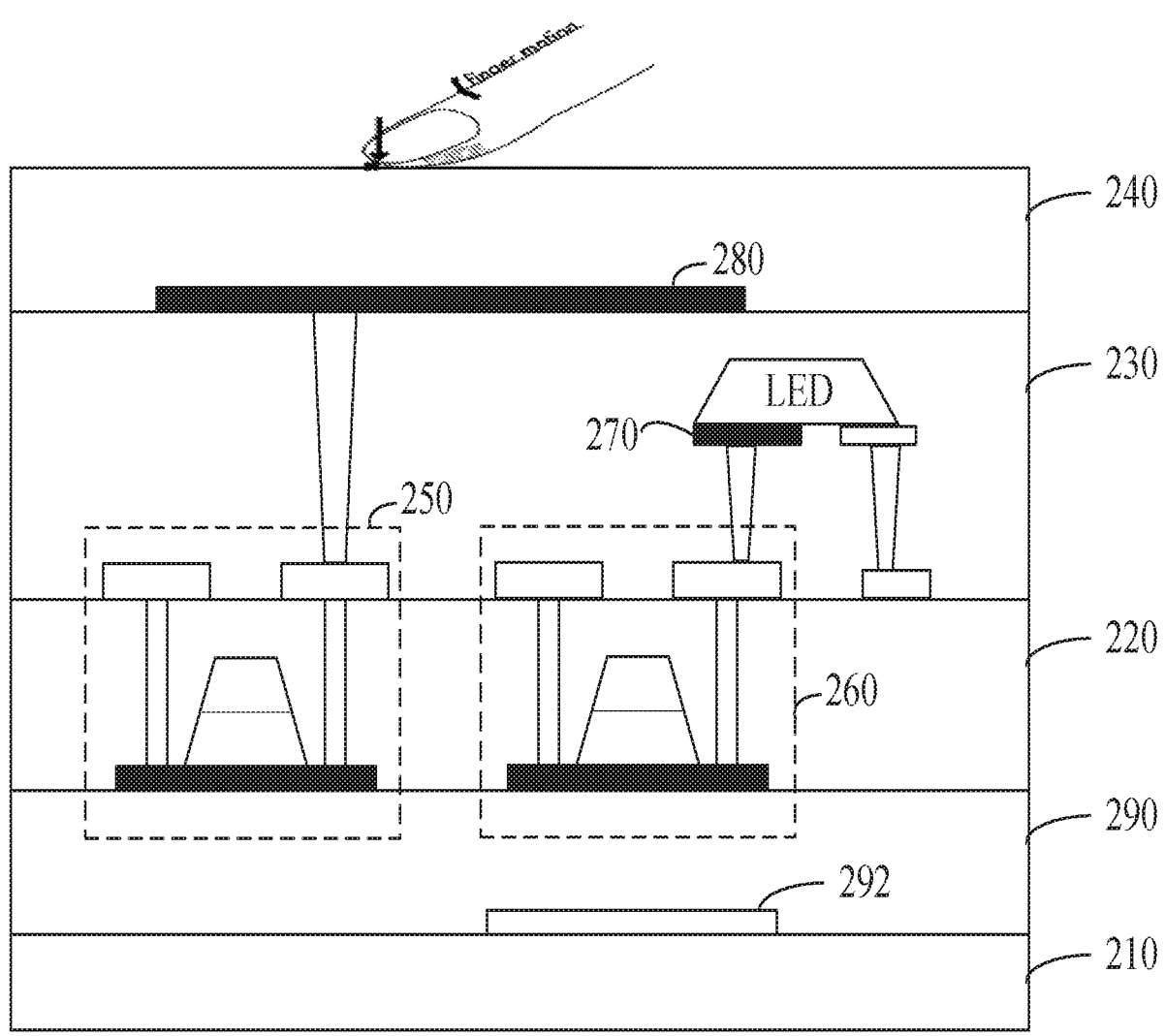
FIG. 2 is a second structural diagram of an electrostatic feedback display array according to an embodiment of the invention.

In one embodiment, as shown in FIG. 2, an electrostatic feedback display array includes a substrate 210, an insulation layer 220 on the substrate 210, a passivation layer 230 on the insulation 220, a dielectric layer 240 on the passivation layer 230, an inductive TFT device 250 located in the insulation layer 220, and the driving TFT device 260 located in the insulation 220. The electrostatic feedback display array also includes a buffer layer 290 located between the substrate 210 and the insulation 220, and a light-shielding component 292 located in the buffer layer 290 for the shielding the driving TFT device 260. Specifically, the passivation layer 230 is equipped with a LED device and electrically connected to a first electrode device 270 of the LED device. The dielectric layer 240 is equipped with a second electrode 280. The source terminal of the inductive TFT device 250 is electrically connected to the second electrode 280. The source terminal of the driving TFT device 260 is electrically connected to the first electrode 270. The gate terminal of the driving TFT device 260 is electrically connected to the source terminal of the inductive TFT device 250.

In particular, the buffer layer 290 can be a protective layer covering the substrate to prevent water vapor and impurity particles from entering the display array, and to improve the reliability of the display array. The light-shielding component 292 can be used to block light leakage from the LED device in a light-emitting state through the driving TFT device 260, and improve the light-emitting display performance of the display array.

Specifically, the buffer layer 290 is disposed on the substrate 210. The insulation layer 220 is disposed on the buffer layer 290. The passivation layer 230 is disposed on the insulation layer 220. The dielectric layer 240 is disposed on the passivation layer 230. The substrate 210, the buffer layer 290, the insulation layer 220, the passivation layer 230, and the dielectric layer 240 are arranged tightly layered. The buffer layer 290 has a light-shielding component 292 for shielding the driving TFT device 260. The passivation layer 230 is equipped with a LED device and electrically connected to a first electrode of the LED device. The dielectric layer 240 has a second electrode 280. The inductive TFT device 250 is located within the insulation layer 220. The source terminal of the inductive TFT device 250 is electrically connected to the second electrode 280. The driving TFT device 260 is located within the insulation 220. The driving TFT device 260 has a source terminal electrically connected to the first electrode 270, and a gate terminal electrically connected to the source terminal of the inductive TFT device 250. Further, when a high-frequency high voltage level signal is input to a gate terminal of the inductive TFT device 250, and a high voltage level signal is input to the drain terminal of inductive TFT device 250, the inductive TFT device 250 is on. The voltage level of the second electrode 280 varies with the input high-frequency high voltage level signal. If a finger touches the dielectric layer, static electricity is produced between the second electrode 280 and the finger. When a high voltage level signal is input to the drain terminal of the inductive TFT device 250, and a low voltage level signal is input to the gate input of the inductive TFT device 250, the voltage level of the second electrode 280 is zeroed to an initial voltage level. When the finger touches the dielectric layer surface, the voltage level of the second electrode 280 is raised, which then drives the driving TFT device 260 transmits a voltage level signal to the LED device through the first electrode 270. The light-shielding component blocks light leakage from the LED device in a light-emitting state through the driving TFT device 260. Thus, the active-driven electrostatic feedback modulation is realized, while the light-emitting display performance of the display array is guaranteed.

In the above embodiment, the light-shielding component blocks the light leakage of the optical display pattern through the driving TFT device in the light-emitting state, and improve the light-emitting display performance of the display array. The embodiment utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

In a specific embodiment, the insulation layer is a transparent insulation layer.

In particular, the insulation layer adopts transparent insulation material, which does not affect the self-illuminating display, and improves the light emitting display performance of the display array.

In a specific embodiment, the second electrode is a transparent electrode.

In particular, the second electrode is an electrode of the transparent material, which does not affect the self-illuminating display, and improves the light-emitting display performance of the display array.

In a specific embodiment, the driving TFT device is an indium gallium zinc oxide (IGZO) type TFT device.

In particular, IGZO is a material for a trench layer used in the next generation of thin-film transistor technology.

In one example, the driving TFT device may also be a low-temperature polysilicon (LTPS) type TFT device.

In a specific embodiment, the inductive TFT device is an IGZO type TFT device.

In particular, IGZO is a trench layer material for the next generation of thin-film transistor technology.

In one example, the inductive TFT device may be an LTPS-type TFT device.

Figure 3:
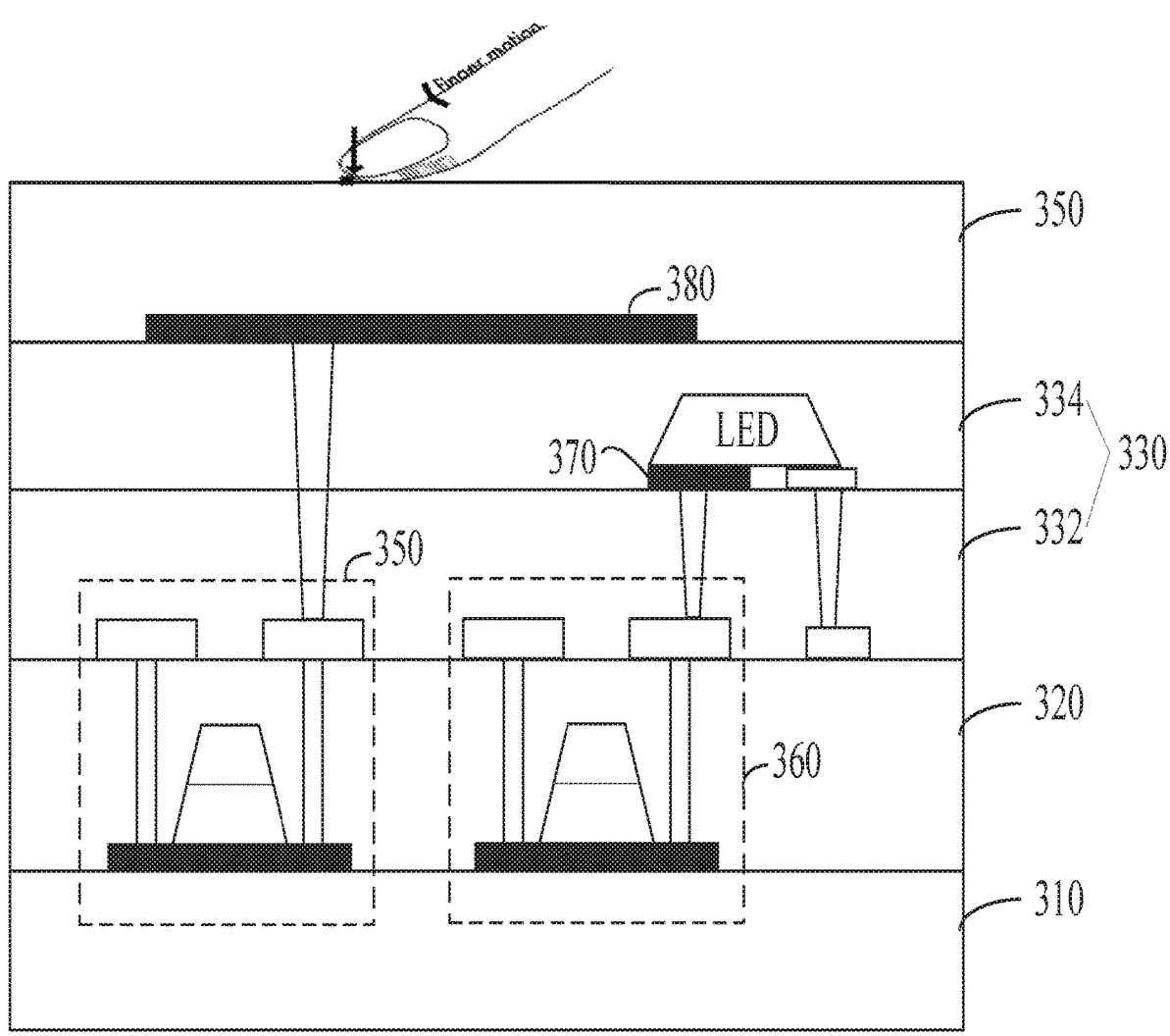
FIG. 3 is a third structural diagram of an electrostatic feedback display array according to an embodiment of the invention.

In one embodiment, as shown in FIG. 3, an electrostatic feedback display array includes a substrate 310, an insulation layer 320 on the substrate 310, a passivation layer 330 on the insulation 320, a dielectric layer 340 on the passivation layer 330, an inductive TFT device 350 located in the insulation 320, and a driving TFT device 360 located in the insulation 320. The passivation layer 330 is equipped with LED device and electrically connected to a first electrode 370 of the LED device. The dielectric layer 340 is equipped with the second electrode 380. The source terminal of the inductive TFT device 350 is electrically connected to the second electrode 380. The driving TFT device 360 has a source terminal electrically connected to the first electrode 370, and a gate terminal electrically connected to the source terminal of the inductive TFT device 350. In particular, the passivation layer 330 includes the first passivation sublayer 332 located on the insulation layer 320 and the second passivation sublayer 334 located between the first passivation sublayer 332 and the dielectric layer 340. The LED device and the first electrode 370 are located in the second passivation sublayer 334.

Specifically, the first passivation sublayer 332 is located on the insulation layer 320, and the drain terminal and source terminal of the connected driving TFT device 360 can be located in the first passivation sublayer 332. The first electrode 370 is connected by a metal wire to the source terminal of the driving TFT device 360. The first passivation sublayer 332 can transform surfaces of the drain terminal and the source terminal of the driving TFT device 360 and the metal wire into a state that is not easily oxidized, thereby delaying corrosion of metal parts, such as the drain terminal of the driving TFT device 360, the source terminal of the driving TFT device 360, and the metal wire.

The second passivation sublayer 334 is located between the first passivation sublayer 332 and the dielectric layer 340. The LED device and the first electrode 370 are located in the second passivation sublayer 334. The second passivation sublayer 334 can be used to make the metal bare part of the LED device and surfaces of the first electrode 370 into a state that is not easily oxidized, and delay corrosion of the metal bare part of the LED device and the first electrode 370.

Further, the second passivation sublayer 334 can realize passivation of the metal connection between the second electrode 380 and the source terminal of the inductive TFT device 350.

In the embodiment, the first passivation sublayer is disposed on the insulation layer, and the second passivation sublayer is disposed between the first passivation sublayer and the dielectric layer. The first passivation layer and the second passivation sublayer realize an oxidation state of the metal bare parts, and thus delay corrosion of the bare metal parts. The embodiment utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

In a specific embodiment of the electrostatic feedback display array provided by this application, and a protective film is located on the dielectric layer.

In particular, the protective film can include but not limited to a polyvinylidene fluoride (PVDF) protective film.

Figure 4:
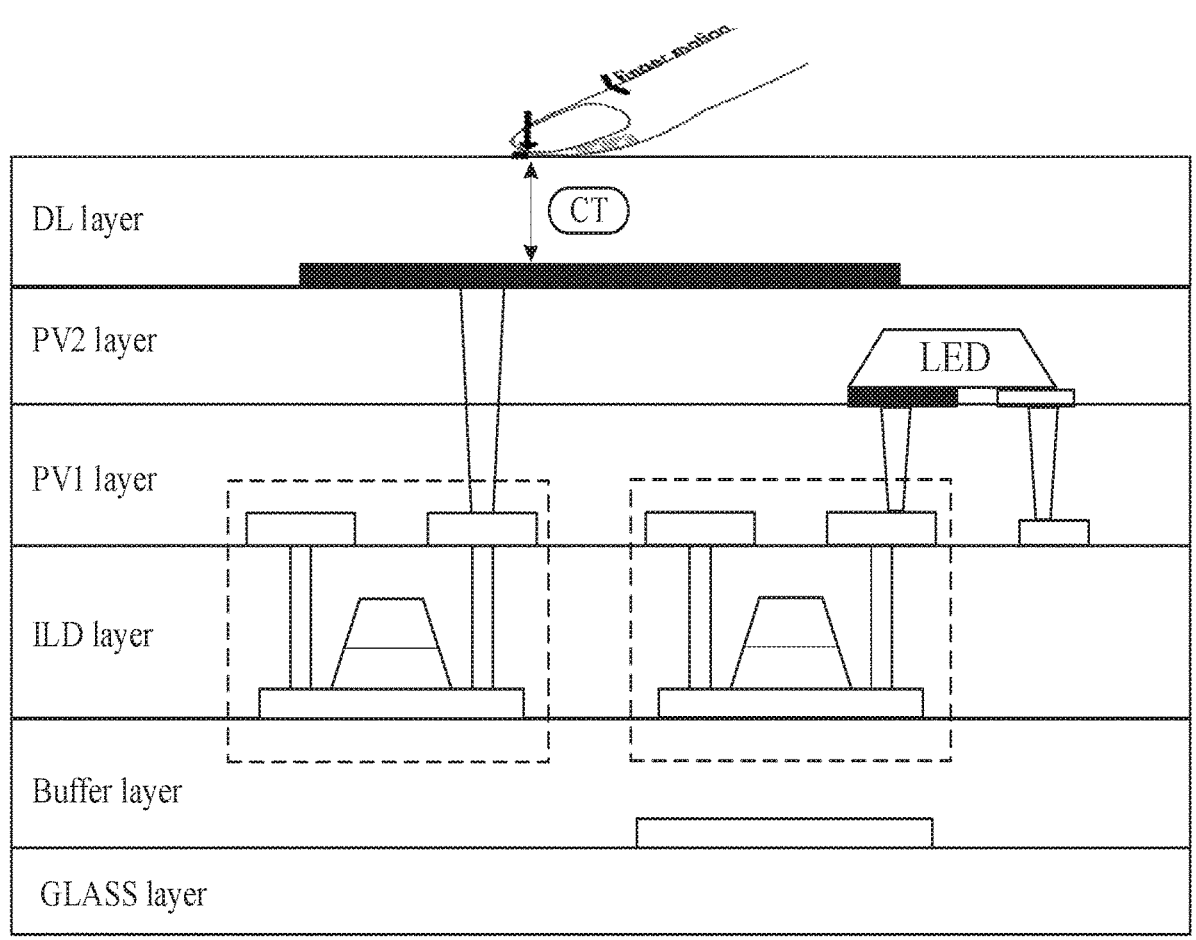
FIG. 4 is a third structural diagram of an electrostatic feedback display array according to an embodiment of the invention.

In one embodiment, as shown in FIG. 4, an electrostatic feedback display array includes a substrate (GLASS layer), an insulation layer 420 (ILD layer) located on the substrate, a passivation layer on the insulation layer, a dielectric layer (DL layer) on the passivation layer, and an inductive TFT device located in the insulation layer, and driving TFT devices located in the insulation. The electrostatic feedback display array further includes a buffer layer (Buffer layer) between the substrate and the insulation layer. The buffer layer has a light-shielding component for shielding the driving TFT device.

In particular, the passivation layer is equipped with an LED device and electrically connected to the first electrode of the LED device. The dielectric layer is equipped with the second electrode. The source terminal of the inductive TFT device is electrically connected to the second electrode. The source terminal of the driving TFT device is electrically connected to the first electrode, and the gate terminal of the driving TFT device is electrically connected to the source terminal of the inductive TFT device. The passivation layer includes the first passivation sublayer (PV1 layer) located on the insulation layer and the second passivation sublayer (PV2 layer) located between the first passivation sublayer and the dielectric layer. The LED device and first electrode are located in the second passivated sublayer Specifically, the light-shielding component can be used to block light leakage from the LED device in a light-emitting state through the driving TFT device, and improve the light-emitting display performance of the display array. The first passivation sublayer is disposed on the insulation layer. The second passivation sublayer is disposed between the first passivation sublayer and the dielectric layer. The embodiment utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

It should be noted that in FIG. 4, GI refers to the insulation layer between the metal part of gate terminal and the semiconductor Si. IGZO refers to Indium Gallium Zinc Oxide. GATE refers to the gate terminal of a TFT. LS refers to a layer of the light-shielding component. CT is used to indicate the equivalent capacitor.

In one embodiment, as shown in FIG. 5, a method for actively driving electrostatic feedback display array includes the following steps:

Step S510, when a finger touches the dielectric layer for the first time, inputting a high voltage level signal into the gate terminal of the inductive TFT device, a high-frequency high voltage level signal into the drain terminal of the inductive TFT device, wherein the high voltage level signal and the high-frequency high voltage level signal are used to generate static electricity between the second electrode and the finger.

Step S520, inputting a high voltage level signal to the gate terminal of the inductive TFT device, and a low voltage level signal to the drain terminal of the inductive TFT device, wherein the high voltage level signal and the low voltage level signal are used to drive a voltage level of the second electrode to zero.

Step S530, using the static electricity to drive the second electrode to generate a voltage level when the finger touches the dielectric layer for a second time, wherein the generated voltage level is used to drive the driving TFT device to transmit a voltage signal to an LED device.

Specifically, when a high-frequency high voltage level signal is input to the gate terminal of the inductive TFT device, and a high voltage level signal is input to the drain terminal of the inductive TFT device, the inductive TFT device is on, and the voltage level of the second electrode varies with the input high-frequency high voltage level signal. If a finger touches the dielectric layer, a voltage level of the second electrode raises, which drives the driving TFT device to transmit a voltage signal to the LED device, and realizes actively driven electrostatic feedback modulation. The embodiment utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

It should be understood that although the steps in the flowchart in FIG. 5 are shown in order as indicated by the arrows, they are not necessarily performed in the order indicated by the arrows. Unless it is clearly stated in this article, these steps are not restricted to sequential execution and can be performed in other order. Moreover, at least some of the steps in FIG. 5 may include multiple sub-steps or stages that are not necessarily performed at the same time, but can be performed at different times. The order in which these sub-steps or stages are performed is not necessarily sequential. Instead, it can be performed alternately or alternately with other steps, sub-steps or at least one part of the stage.

Figure 6:
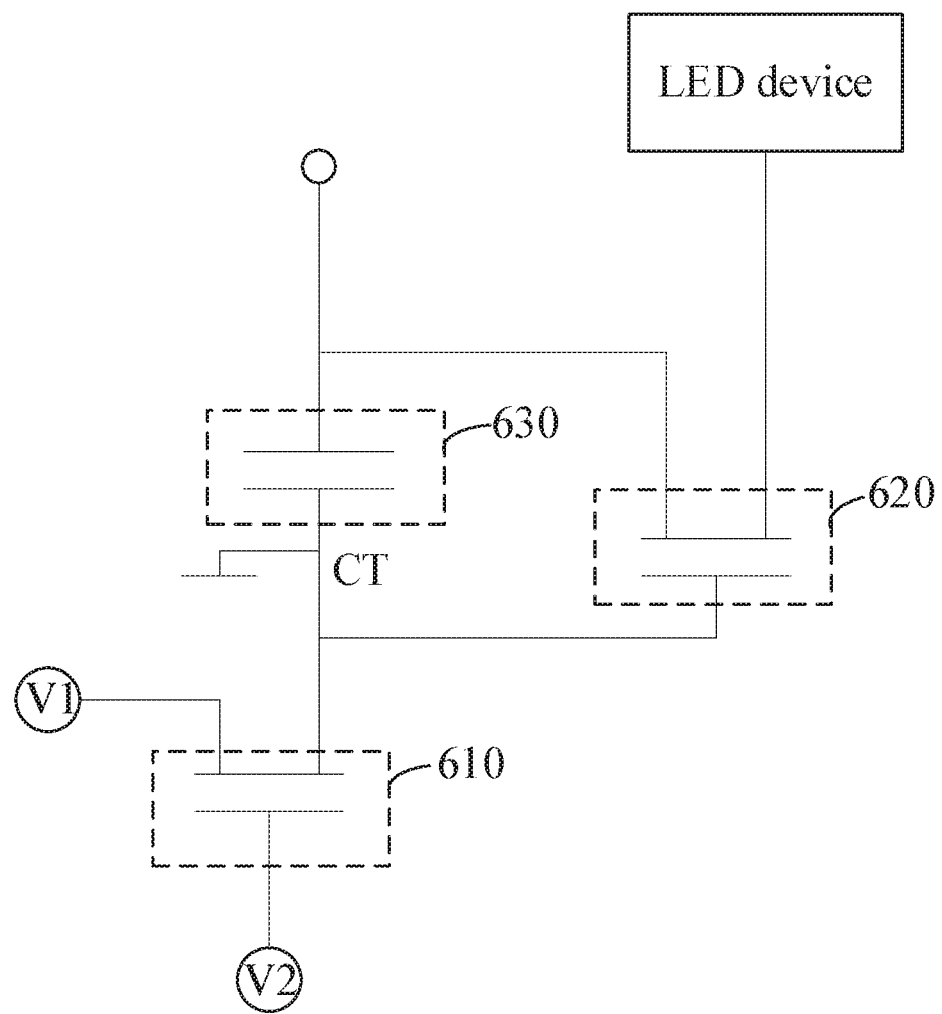
FIG. 6 is a structure diagram of a circuit for actively driving an electrostatic feedback display array according to an embodiment of the invention.

In one embodiment, shown in FIG. 6, a circuit for actively driving an electrostatic feedback display array includes an inductive TFT device 610, a driving TFT device 620 and a capacitor 630.

The source terminal of the inductive TFT device 610 is connected to the gate terminal of the driving TFT device 620. The capacitor 630 has one end connected to the source terminal of the inductive TFT device 610, and the other end connected to the drain terminal of the driving TFT device 620. The source terminal of the driving TFT device 620 is used to connect the LED device.

Specifically, the source terminal of the inductive TFT device 610 is electrically connected to a gate terminal of the driving TFT device 620. The capacitor 630 has one end connected to the source terminal of the inductive TFT device 610, and the other end connected to the drain terminal of the driving TFT device 620. The source terminal of the driving TFT device 620 is used to connect the LED device. When a high-frequency high voltage level signal is input to the gate terminal of the inductive TFT device 610, and a high voltage level signal is input to the drain terminal of the inductive TFT device 610, the inductive TFT device 610 is on, and the voltage level of the capacitor 630 varies with the input high-frequency high voltage level signal. When a high voltage level signal is input to the drain terminal of the inductive TFT device 610, and a low voltage level signal is input to the gate terminal of the inductive TFT device 610, the voltage level of the capacitor 630 is zeroed to an initial voltage level. When a voltage signal is input to the other end of the capacitor 630, which drives the driving TFT device 620 to send a voltage signal to the LED device, active driving electrostatic feedback modulation is thus realized. The embodiment utilizes the TFT device to control a touch electrostatic feedback switch, integrates electrostatic feedback, capacitance sensing and display functions, realizes boundary perceptible haptic feedbacks, avoids direct connection and harmful consequences of high voltage signal source to the human body, and improves the safety of feedback triggering.

Figure 7:
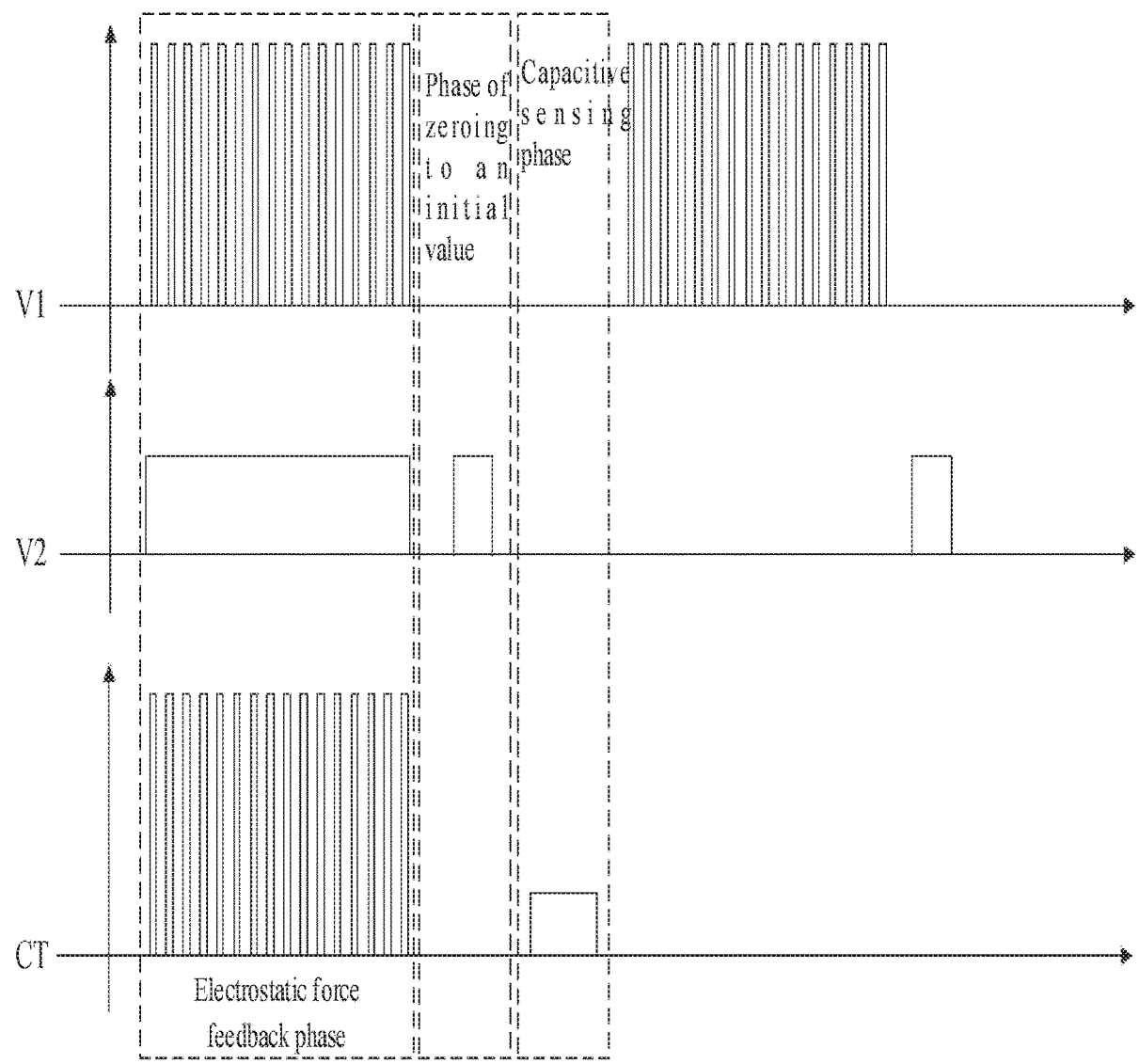
FIG. 7 a timing sequence of the circuit for actively driving an electrostatic feedback display array according to an embodiment of the invention.

In one example, FIG. 7 shows a timing sequence waveform diagram of the circuit for actively driving the electrostatic feedback display array. Combined with the circuit for actively driving the electrostatic feedback display array in FIG. 6, the active driving circuit of the array, the timing of active driving can be divided into three phases: electrostatic force feedback, zeroing, and capacitive sensing.

Specifically, the electrostatic force feedback phase: V1 is fed with a high-frequency high voltage level signal. When a high voltage level signal is input to the gate terminal (V2) of the inductive TFT device, the inductive TFT device is on, and a voltage level of the capacitor (CT) varies with V1. If a finger touch a surface of the dielectric layer of the display array, an electrostatic force is produced for the finger. Zeroing phase for zeroing to the initial voltage level phase: a low voltage level signal is input to V1, a high voltage level signal is input to the gate terminal (V2) of the inductive TFT device, the capacitor is zeroed to the initial voltage level. Capacitive sensing phase: When a finger touches the dielectric layer surface, a voltage level of the capacitor increases, the source terminal of the driving TFT device outputs a voltage signal, which can realize the electrostatic feedback as well as capacitive sensing function, and avoid direct connection and harmful consequences of high voltage signal source to the human body, and improves the safety of feedback triggering.

Further, if in the electrostatic force feedback phase, a high-frequency high voltage level signal is input to the V1, and a low voltage level signal is input to the gate terminal (V2) of the inductive TFT device, the inductive TFT device is off, the capacitor (CT) does not produce a voltage signal. If a finger touch a surface of the dielectric layer of the display array, the finger does not produce electrostatic electricity. In the zeroing phase for zeroing to the initial voltage level: A low voltage level signal is input to V1, a high voltage level signal is input to the gate terminal (V2) of the inductive TFT device, and the voltage level of the capacitor is still in its initial stage. During the capacitive sensing phase, when a finger touches the dielectric layer surface, the voltage level of the capacitor does not change, and the source terminal of the driving TFT device does not output a voltage signal.

A person with ordinary skills in the art can understand the method may be implemented by a computer program which instructs relevant hardware to perform all or part of the above embodiments of the method. The computer program may be stored in a non-volatile computer readable storage media, when in execution, may include a process such as the detailed method of the embodiments. Any reference to memory, storage, database or other media used in the embodiments provided in this application may include non-volatile and/or volatile memory. Non-volatile memory may include read-only memory (ROM), programmable ROM (PROM), electrically programmable ROM (EPROM), electro-erasable programmable ROM (EEPROM) or flash memory. Volatile memory may include either random access memory (RAM) or external high-speed buffer memory. As an illustration rather than a limitation, RAM is available in a variety of forms, such as static RAM (SRAM), dynamic RAM (DRAM), synchronous DRAM (SDRAM), double data rate synchronous dynamic random access memory (DDR SDRAM), enhanced SDRAM (ESDRAM), synchlink DRAM (SLDRAM), Rambus direct RAM (RDRAM), direct Rambus dynamic RAM (DRDRAM), and memory dynamic bus (RDRAM).

The technical features of the embodiments described above may be arbitrarily combined. To make the description concise, not all possible combinations of the technical features in the above embodiments are described herein. However, as long as combinations of these technical features have not contradiction, the combinations should be considered to be under protection by claims in this specification.

The above embodiments represent only a few specific and detailed embodiments of the invention, but cannot be understood as a limitation on the scope of the invention. It should be noted that, for a person with ordinary skills in the art, without leaving the idea of this application, may commit a number of modification and improvements, which fall within the scope of claims of this application. Therefore, the scope for protection of this patent application shall be subject to the attached claims.

What is claimed is:

1. An electrostatic feedback display array comprising:
   a substrate;
   an insulation layer located on the substrate;
   a passivation layer located on the insulation layer, and electrically connected to a first electrode of a LED device located on the passivation layer;
   a dielectric layer located on the passivation layer, and equipped with a second electrode;
   an inductive TFT device located within the insulation layer, wherein a source terminal of the inductive TFT device is electrically connected to the second electrode; and
   a driving TFT device located within the insulation layer, wherein the driving TFT device comprises a source terminal of electrically connected to the first electrode, and a gate terminal electrically connected to the source terminal of the inductive TFT device.

2. The electrostatic feedback display array of claim 1, further comprising a buffer layer located between the substrate and the insulation layer, wherein the buffer layer is equipped with a light-shielding component to block the driving TFT device.

3. The electrostatic feedback display array of claim 1, wherein the insulation layer is a transparent insulation layer.

4. The electrostatic feedback display array of claim 1, wherein the second electrode is a transparent electrode.

5. The electrostatic feedback display array of claim 1, wherein the driving TFT device is an IGZO type TFT device, and the inductive TFT device is an IGZO type TFT device.

6. The electrostatic feedback display array of claim 1, wherein the passivation layer comprises a first passivation sublayer located on the insulation layer and a second passivation sublayer arranged between the first passivation sublayer and the dielectric layer; and
   the LED device and the first electrode are located in the second passivation sublayer.

7. The electrostatic feedback display array of claim 1, wherein the substrate is a glass plate.

8. The electrostatic feedback display array of claim 1, further comprising a protective film located on the dielectric layer.

9. A method for actively driving an electrostatic feedback display array, comprising the following steps:
   inputting a high voltage level signal into a gate terminal of an inductive TFT device, and a high-frequency high voltage level signal to a drain terminal of the inductive TFT device when a finger touches a dielectric layer for a first time, wherein the high voltage level signal and the high-frequency high voltage level signal drives generation of static electricity between a second electrode and the finger;
   inputting a high voltage level signal to the gate terminal of the inductive TFT device, and a low voltage level signal to the drain terminal of the inductive TFT device, wherein the high voltage level signal and the low voltage level signal are used to drive a voltage level of the second electrode to zero; and
   using the static electricity to drive the second electrode to generate a voltage level when the finger touches the dielectric layer for a second time, wherein the generated voltage level is used to drive a driving TFT device to transmit a voltage signal to an LED device.

10. A circuit for actively driving an electrostatic feedback display array, comprising:
    an inductive TFT device;
    a driving TFT device; and
    a capacitor;
    wherein a source terminal of the inductive TFT device is connected to a gate terminal of the driving TFT device, one end of the capacitor is connected to the source terminal of the inductive TFT device, the other end of the capacitor is connected to a drain terminal of the driving TFT device, and a source terminal of the driving TFT device is used to connect an LED device.

* * * * *